United States Patent [19]

Nagata et al.

[11] Patent Number: 5,035,942

[45] Date of Patent: Jul. 30, 1991

[54] FLEXIBLE MATERIALS FOR REFLECTING ELECTROMAGNETIC WAVE

[75] Inventors: Yoshikazu Nagata; Yoshiyuki Nishimura, both of Kamisumachi, Japan

[73] Assignee: Petoca Ltd., Tokyo, Japan

[21] Appl. No.: 313,822

[22] Filed: Feb. 23, 1989

[30] Foreign Application Priority Data

Feb. 26, 1988 [JP] Japan ................. 63-419765

[51] Int. Cl.$^5$ ............. B32B 11/00; D04K 3/08; H05K 9/00
[52] U.S. Cl. ............... 428/288; 174/35 MS; 428/296; 428/408
[58] Field of Search ............ 428/408, 288, 296; 174/35 MS

[56] References Cited

U.S. PATENT DOCUMENTS

| 4,470,960 | 9/1984 | Uemura et al. | 423/447.1 |
| 4,590,055 | 5/1986 | Yamada et al. | 423/447.4 |
| 4,861,653 | 8/1989 | Parrish | 423/447.4 |

FOREIGN PATENT DOCUMENTS

| 168639 | 1/1986 | European Pat. Off. . |
| 4732148 | 11/1969 | Japan . |
| 50-101405 | 1/1975 | Japan . |
| 5247014 | 10/1975 | Japan . |
| 62-90320 | 10/1985 | Japan . |
| 2131781 | 6/1984 | United Kingdom . |

Primary Examiner—James C. Cannon
Attorney, Agent, or Firm—Armstrong, Nikaido, Marmelstein, Kubovcik & Murray

[57] ABSTRACT

Flexible materials for reflecting electromagnetic waves can be provided by using adhesive type non-woven fabrics formed by self adhesion of the principal component of pitch based carbon fibers.

2 Claims, No Drawings

FLEXIBLE MATERIALS FOR REFLECTING ELECTROMAGNETIC WAVE

BACKGROUND OF THE INVENTION

This invention relates to flexible materials which reflect, i.e. hardly pass electromagnetic waves having frequencies used in the electric communication or the like.

Since miniaturization of electronic instruments has been advanced lately, there is a tendency of casings of these materials turning from metals to plastics. On account of this tendency, mutual interference of electronic instruments and interference of communication are increasing remarkably and strengthening of the shielding of electronic instruments from electromagnetic waves is becoming necessary. Known materials having large capacity for shielding from electromagnetic waves are mostly hard and strong materials, lacking in flexibility. It is essentially difficult to shape into a flexible structure having a large capacity for shielding from electromagnetic waves.

It is an object of the present invention to provide flexible electromagnetic-wave-shielding materials comprising carbon fibers, which materials are difficult to be produced from metals.

As a shielding method from electromagnetic waves of a frequencies used in the electric communication or radar, there is a method of absorbing electromagnetic waves or a method of reflecting it. Of these two, for the method of absorbing electromagnetic wave, satisfactory materials has not been found because materials having an absorption factor which shows small dependency on frequency are few.

For reflecting electromagnetic waves, it has been known from old time that use of a material of high electric conductivity serve the purpose. For preventing the interference of the electric communication, an electronic instrument casing made of a metal a shieldcovering of an electric wire by braiding of a metal wire, etc. have been hitherto used.

The problem of conventional electromagnetic wave shielding apparatus has been in the point of difficulty of shaping of small sized one and also in the point of extremely high cost compared with shaping of plastics in case of casings or the like. In case of shield covering wire, the problem has been that the wire is hard and thick and wiring in narrow spaces is difficult.

For the above-mentioned reason, electronic instruments which neglect the shielding from electromagnetic waves has increased. Thus the interference between instruments and the interference of communication have increased and further, the occurrence of accident on account of malfunction has been frequent. From the reconsideration of such status, the shielding of electronic instruments from electromagnetic waves has been recently promoted. Further, for the purpose of prevention of accidents, regulation by law has now been advanced.

For the shielding of casings made of plastics from electromagnetic waves, a process of flame coating of zinc, a process of coating with an electroconductive coating material or a process for preparing electroconductive plastics casing has now being used. These processes are effective for casings having definite shape, but it is the present status that a satisfactory material has not been obtained to which particular flexibility and elasticity are required, e.g., an electric wire, etc.

For the flexible shielding materials from electromagnetic waves, a metal foil, a vacuum evaporation metal film, a metal electroplated film have been used, but the metal foil has a drawbacks in that strength is low and shape stability is poor. In case of vacuum evaporation metal film and the metal electroplated film there are problems in that cost is high and reflection capability of electromagnetic waves is not sufficient.

As the flexible shielding materials from electromagnetic waves, metal nets are also useful, but when a contact resistance of the metal wire is large, since electromagnetic waves leak from the mesh of the metal nets, shielding capacity is small and moreover there is a general problem in its poor durability.

The shielding from electromagnetic waves used for radar, has two objects, i.e. the one is to cancel the disturbance of electronic instruments, etc. and the other is to camouflage the radar. In radar camouflage, there is a type which is spread in air and another type which covers facilities on the ground. For the former, small flakes of metal foils are used. As this usage does not require the durability there is no special problem. For the latter, it is very difficult to use, because the durability is required and moreover the visual camouflage is required also.

For such use, it is necessary to deal with a combination of several kinds of material which have a good coating property and a good adhesive property.

An object of the present invention is, as abovementioned, to overcome the problems of the conventional shielding material for electromagnetic waves, i.e. lack of flexibility.

The above-mentioned object can be overcome by the flexible material for reflecting electromagnetic waves of the present invention.

SUMMARY OF THE INVENTION

The present invention resides in flexible materials having a reflection capacity for electromagnetic waves and comprising non-woven fabrics formed by self-adhesion of its principal component pitch based carbon fibers.

The carbon fibers, as a raw material of the reflection material for electromagnetic waves of the present invention, are preferably a material having relatively high electric conductivity. Further it is preferably a pitch based carbon fibers having high electric conductivity, even when a carbonization temperature is relatively low. When PAN based, cellulose based, PVA based carbon fibers are mixed, it is preferable that the carbonization temperature is higher than 2000° C. The carbonization temperature for pitch-based carbon fibers is preferably 1400° C or higher.

As for processing carbon fibers into non-woven fabrics, any of various process hereinafter explained will be used, but in case of pitch-based carbon fibers, since it is preferable that length of fibers is long, it is preferable that melt spun pitch fibers are immediately turned into sheets and then into non-woven fabrics and carbonized.

As for the spinning process, any of the following processes, i.e. a spunbond type spinning process in which melted pitch is extruded from a common spinning nozzles and drawn by gas stream or rollers, a melt blow type spinning process in which extruding is carried out from a spinning hole or a slit having an outlet in a high speed gas stream, and a centrifugal type spinning process in which spreading is carried out by centrifugal force from pots revolving at a high speed to turn into liquid stream, can be adopted. But the melt blow process can produce a relatively uniform sheet at a low cost, and accordingly it is preferable.

In the melt blow process, a process in which a row of spinning holes or a spinning slit of the pitch is provided in a blow-out slit of high speed gas stream, and a process in which one or several spinning holes are provided in a blow-out hole of high velocity gas stream, have been known, but any of the above-mentioned processes can be used in the present invention.

The pitch used in the present invention is a high softening point pitch capable of being subjected to melt spinning and infusiblization treatment, preferably an optically anisotropic pitch. It is most preferably a substantially 100 % optical anisotropic pitch.

The pitch used in the present invention may be one kind of pitch, and a mixture of 2 or more kinds of pitch can also be used. Mixing of two or more kinds of pitch for spinning solution is not preferable in regard to spinning condition, but by the spinning of different kinds of pitch from different spinning holes, it is possible to carry out mixing pitch fibers having different infusiblization velocities and to use low infusiblization velocity pitch fibers as a binder taking advantage of its melting property during the carbonization. Further by utilizing the difference of shrinkage of fibers during the carbonization treatment according to the molecular structure, it is possible to increase the bulkiness of the resulting sheet.

As for self-adhesive pitch fibers used in the present invention, fibers in which the infusiblization is made incomplete by shortening the infusiblization time, those fibers in which the infusiblization initiation temperature has been made higher to make the infusiblization incomplete, and those fibers in which the infusiblization treatment has been carried out at a low temperature to make the infusiblization incomplete are used preferably.

The incompletely infusiblized pitch fibers cause self-adhesion during the carbonization by melting at the crossing points of fibers. Fibers in the outside of the crossing points show only a little extent of shrinkage and do not produce other change of shape. On the other hand, if infusiblization is made excessively weak or omitted, the pitch fibers melt and turn into liquid drops and do not leave the shape of a non-woven fiber form.

In the materials for reflecting electromagnetic waves of the present invention, carbon fibers having a good electric conductivity are adhered at their principal crossing points. Electric resistance at the contact point is smaller as compared with the case where the adhesion is made through an electric conductive binder at their principal crossing point when an electromagnetic wave is transmitted, since damping of current generated in the inside of a conductor is small, the electromagnetic wave radiated by this current is sufficiently large, it is considered penetrating electromagnetic wave becomes almost disappeared and almost 100 % is reflected.

According to the measurement by the method of Kansai Densi Kogyo Shinko Center, it has been determined that the shielding capacity is greater than 50 dB in the region of 100 MHz to 1000 MHz. In the material for reflecting electromagnetic waves of the present invention, it is possible to contain metal nets, carbon fiber fabrics in the inside or on the surface for the purpose of shape stability improvement. Further, it is possible to have an adhesive layer or sticking agent layer in order to put sheet together with other materials. Further it is possible to carry out processing of flock, flock processing, resin coating, laminate processing with film, etc.

The present invention is further illustrated by the following non-limitative examples.

EXAMPLE 1

As a raw material pitch, a petroleum based pitch having a softening point of 285° C and a proportion of optical anisotropy of 100 % was used. By using a spinneret having a diameter of 0.8 mm in which tubular nozzles for extruding the raw material having an inside diameter of 0.3 mm and outside diameter of 0.6 mm are accommodated and by ejecting heated air from the circumference of the tubular nozzles and pulling out melted pitch, spinning was carried out. Delivery amount of the pitch was 12 g/80 holes min. Pitch temperature was 340° C, spinneret temperature was 430° C, flow amount of heated air was 0.45 kg/min., and temperature of heated air was 470° C.

The spun fibers were collected on a belt by aspirating from behind a belt, collecting part of which is made of 20 mesh stainless metal net. Resulting sheet was subjected to infusiblization treatment while the temperature was elevated at a heating rate of 1° C/min. till 270° C. The infusiblization by this treatment was incomplete. When carbonization treatment was carried out in an inert gas furnace at a highest temperature of 2000° C, resulting carbon fibers sheet was adhered by melting at the crossing point of fibers and unified non-woven fabrics were obtained.

The reflection rate of this non-woven fabrics was extremely high, but as an accurate measurement was difficult, for practical performance, measurement was made according to a method of Kansai Denshi Kogyo Shinko center, whereby the shielding values of 70 dB at 100 MHZ, 60 dB at 500 MHZ, and 60 dB at 1000 MHZ were obtained.

EXAMPLE 2

As a raw material pitch, a petroleum based pitch having a softening point of 287° C, and a proportion of optical anisotropy of 99 % was used. By spinneret having 3000 spinning holes arranged in 3 linear row and having a diameter of 0.15 mm, spinning was carried out. Immediately after cooling, aspiration of spun fibers was carried out by slit-form drawing nozzle. And the fibers were ejected out on a net conveyer to pile up into sheet form.

After pressing resulting sheet between net conveyers, infusiblization was carried out according to a common procedure Resulting sheet was fed by placing on a net conveyer, and after piling up the above-mentioned pitch fibers thereupon, light infusiblization treatment was carried out. Then carbonization treatment was carried out. Whereby non-woven fabrics were made by the self adhesion between pitch fibers. Resulting non-woven fabrics showed superior shielding capacity from electromagnetic waves.

COMPARATIVE EXAMPLE 1.

The sheets of example 2 were adhered according to common procedure by using an electroconductive adhesive. The amount of adhesive used was in the range flexibility of sheet can be sufficiently maintained.

Shielding capacity from electromagnetic waves of resulting non-woven fabrics did not excel 30 dB at 100-1000 MHZ. As a shielding material from electromagnetic waves, it was extremely low quality.

FUNCTION AND EFFECTIVENESS

This invention relates to a flexible material which reflects electromagnetic waves of the frequency used in electric communication and almost does not penetrate the electromagnetic waves.

Since miniaturizing of electron instruments has been advanced lately, there is a tendency of casings of these materials turning from metal to plastics. On account of this tendency, mutual interference of electronic instruments, interference of communication is remarkably increasing. And the strengthening of electromagnetic wave shielding of electronic instrument is becoming necessary. Materials having large capability for shielding electromagnetic waves are found mostly in hard and strong materials lacking in flexibility. It is essentially difficult to shape into a flexible structure and yet having a large capability for shielding electromagnetic waves.

It is an object of the present invention to solve such a difficult problem of producing the above-mentioned materials by providing electromagnetic wave shielding material having carbon fibers as a principal component.

The reflecting material of electromagnetic waves, of the present invention, have not only high reflectivity of electromagnetic waves and shielding capability from of electromagnetic waves and superior flexibility, but also can have ventilation property, coating property and adhesive property by production condition. Further, since it shows superior weather resisting property and heatresisting property, it can be used for exhaust outlet of casing of electronic instruments and can also be used for those which are not fixed such as electric wire cables to shield from electromagnetic waves. It shows superior property of electromagnetic wave shielding for the system which wraps up wholly the facility of electronic instruments such as electromagnetic wave shielding curtain or an electromagnetic wave shielding tent. Further, it shows superior property concerning electromagnetic camouflage fixed on the ground.

What is claimed is:

1. Flexible materials for reflecting electromagnetic waves comprising non-woven fabric formed by self adhesion of pitch based carbon fibers as the principal component.

2. Flexible materials for reflecting electromagnetic waves according to claim 1, wherein said carbon fibers are mesophase pitch based carbon fibers and the shielding capability of said flexible materials is greater than 50 dB in the region of 100 MHz to 1000 MHz.

* * * * *

UNITED STATES PATENT AND TRADEMARK OFFICE
CERTIFICATE OF CORRECTION

PATENT NO. : 5,035,942
DATED : July 30, 1991
INVENTOR(S) : Yoshikazu NAGATA et al It is certified that error appears in the above-identified patent and that said Letters Patent is hereby corrected as shown below:

On the cover page, Item [30], "63-419765" should read -- 63-41976 --.

Signed and Sealed this

Ninth Day of February, 1993

Attest:

STEPHEN G. KUNIN

*Attesting Officer*  Acting Commissioner of Patents and Trademarks